US007078766B2

(12) United States Patent
Chi

(10) Patent No.: US 7,078,766 B2
(45) Date of Patent: Jul. 18, 2006

(54) TRANSISTOR AND LOGIC CIRCUIT ON THIN SILICON-ON-INSULATOR WAFERS BASED ON GATE INDUCED DRAIN LEAKAGE CURRENTS

(75) Inventor: Min-hwa Chi, Hsinchu (TW)

(73) Assignee: Taiwan Semiconductor Mfg. Corp. (TW)

( * ) Notice: Subject to any disclaimer, the term of this patent is extended or adjusted under 35 U.S.C. 154(b) by 0 days.

(21) Appl. No.: 09/865,929

(22) Filed: May 24, 2001

(65) Prior Publication Data

US 2002/0074599 A1 Jun. 20, 2002

Related U.S. Application Data

(62) Division of application No. 09/737,946, filed on Dec. 18, 2000.

(51) Int. Cl.
*H01L 27/01* (2006.01)

(52) U.S. Cl. .............. 257/347; 257/350; 257/357; 257/574; 438/149; 438/152; 438/153; 438/479

(58) Field of Classification Search ............ 257/347, 257/350, 351, 574, 368, 369; 438/149, 479, 438/517, 152, 153, 154, 155, 156
See application file for complete search history.

(56) References Cited

U.S. PATENT DOCUMENTS 5,448,513 A   9/1995   Hu et al.

*Primary Examiner*—Steven Loke
*Assistant Examiner*—Donghee Kang
(74) *Attorney, Agent, or Firm*—Blakely, Sokoloff, Taylor & Zafman, LLP

(57) ABSTRACT

A transistor structure fabricated on thin SOI is disclosed. The transistor on thin SOI has gated n+ and p+ junctions, which serve as switches turning on and off GIDL current on the surface of the junction. GIDL current will flow into the floating body and clamp its potential and can thus serve as an output node. The transistor can function as an inverter. The body (either n-well or p-well) is isolated from the n+ or P+ "GIDL switches" by a region of opposite doping type, i.e., p-base and n-base. The basic building blocks of logic circuits, e.g., NAND and NOR gates, are easily implemented with such transistors on thin SOI wafers. These new transistors on thin SOI only need contacts and metal line connections on the $V_{CC}$ and $V_{SS}$. The connection of fan-outs (between the output and input) can be implemented by capacitor coupling. The transistor structure and operation is useful for high-performance, low-voltage, and low-power VLSI circuits on SOI wafers.

8 Claims, 9 Drawing Sheets

US 7,078,766 B2

TRANSISTOR AND LOGIC CIRCUIT ON THIN SILICON-ON-INSULATOR WAFERS BASED ON GATE INDUCED DRAIN LEAKAGE CURRENTS

This application is a division of application Ser. No. 09/737,946, filed Dec. 18, 2000.

FIELD OF THE INVENTION

The present invention relates to silicon-on-insulator (SOI) integrated circuits, and more particularly, transistor and logic circuits using gate induced drain leakage current formed on a SOI.

BACKGROUND OF THE INVENTION

Silicon-on-insulator (SOI) is gaining popularity as a new technology. Devices formed in SOI have demonstrated significant performance improvement over devices fabricated on bulk wafers. This is because silicon devices have problems with inherent parasitic to junction capacitances. One way to avoid this problem is to fabricate silicon devices on an insulating substrate. Hence, the reason for SOI technology is that it offers the highest performance in terms of power consumption and speed for a given feature size due to minimizing parasitic capacitance.

The present invention provides new transistor and logic circuits that are particularly well suited for SOI wafers.

SUMMARY OF THE INVENTION

A transistor structure fabricated on thin SOI is disclosed. The transistor on thin SOI has gated n+ and p+ junctions, which serve as switches turning on and off GIDL current on the surface of the junction. GIDL current will flow into the floating body and clamp its potential and can thus serve as an output node. The transistor can function as an inverter. The body (either n-well or p-well) is isolated from the n+ or P+ "GIDL switches" by a region of opposite doping type, i.e., p-base and n-base. The basic building blocks of logic circuits, e.g., NAND and NOR gates, are easily implemented with such transistors on thin SOI wafers. These new transistors on thin SOI only need contacts and metal line connections on the $V_{CC}$ and $V_{SS}$. The connection of fan-outs (between the output and input) can be implemented by either capacitor coupling or conventional contact and metal line. The transistor structure and operation is useful for high-performance, low-voltage, and low-power VLSI circuits on SOI wafers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention uses a novel inverter disclosed in my co-pending U.S. patent application Ser. No. 09/177,787 entitled "CMOS Inverter Using Gate Induced Drain Leakage Current" filed Oct. 22, 1998 and hereby incorporated by reference. A description of the inverter is provided below. This is followed by a detailed description of the present invention.

Figure 1:
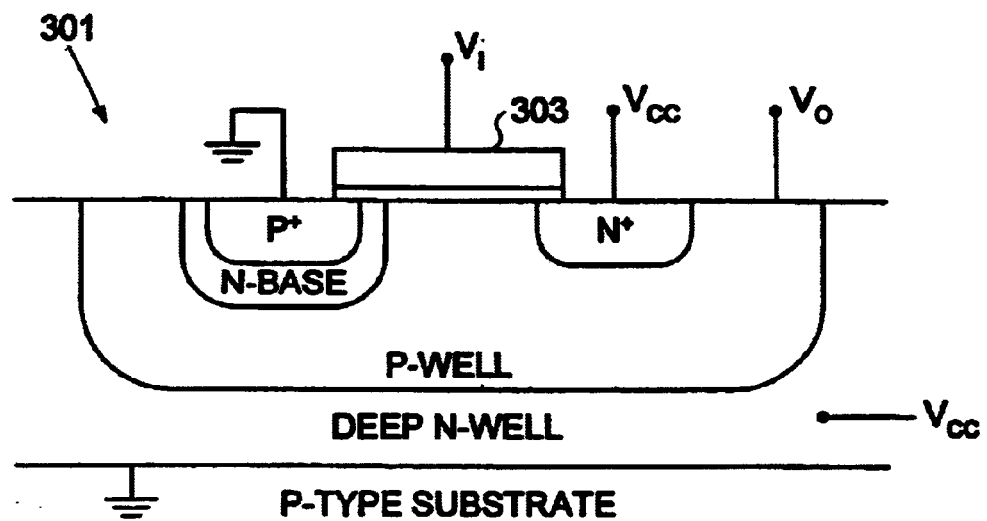
FIG. 1 is a cross-section view of a semiconductor substrate having formed therein a p-well CMOS inverter in accordance with the present invention.

Turning to FIG. 1, a p-type substrate is used as the foundation for the formation of a CMOS inverter 301 in accordance with the present invention. Formed in the p-type substrate is a deep n-well. Preferably, the deep n-well is formed by ion implantation using conventional methods. The deep n-well is preferably approximately 3 microns deep and has a dopant concentration of approximately $10^{15}/cm^3$.

Next, a p-well is formed in the deep n-well using conventional masking and ion implantation technology. The p-well is preferably approximately 1.5 microns deep and has a dopant concentration of $10^{16}/cm^3$.

Next, a gate oxide layer is formed over the substrate. The gate oxide is typically a thin silicon dioxide layer formed by thermal oxidation. Formed atop the gate oxide layer is an in situ doped polysilicon layer. The layer of polysilicon and the layer of gate oxide is then patterned and etched to form a gate structure 303.

After formation of the gate structure 303, an n-base is formed within the p-well. The n-base is self aligned to one edge of the gate structure 303. Preferably, the n– base is formed using conventional ion implantation and then thermal diffusion. As will be seen below, this allows a single mask to be used to form the n– base and the p+ structure. The thermal diffusion allows the n– base to expand laterally so that it extends underneath the gate structure 303. After diffusion, the n-base has a depth of 0.7 microns and has a dopant concentration in the range of $10^{17}/cm^3$. Preferably, the dopant is phosphorous. Notice that the n-base physically separates the p+ region and the p– well Next, a p+ structure is formed within the n– base and is self-aligned to one edge of the gate structure 303. The same mask may be used to form the p+ structure as is used to form the n– base. The p+ structure preferably is formed using ion implantation to a depth of 0.3 microns and having a dopant concentration in the range of $10^{20}/cm^3$. Preferably, the dopant used is boron.

Formed adjacent to the other edge of the gate structure 303 is an n+ structure. The n+ structure is formed in the p-well and is self-aligned to the gate structure 303. Preferably, the n+ structure has a depth of 0.3 microns and has a dopant concentration in the range of $10^{20}/cm^3$. Preferably, the n-type dopant is arsenic.

Note that each of the manufacturing steps described above are commonly used in a CMOS process for forming prior art transistors. Therefore, the inverter of the present invention can be easily integrated into the process for forming standard CMOS transistors.

Finally, conventional methods are used to form contacts and interconnect to the various structures in the inverter 301. For example, the p+ structure and the p-type substrate are connected to ground (or more generically $V_{ss}$) The gate structure 303 is connected to an input terminal $V_i$. The n+ structure and the deep n-well are connected to a biasing voltage $V_{cc}$. Finally, the p-well is electrically connected to the output terminal $V_o$.

In operation, when the input bias $V_i$ is high (or approximately $V_{cc}$), electrons are generated on the surface of the p+ structure by band-to-band tunneling. These band-to-band tunneling generated electrons will flow into the n-base region (which may be at a higher potential than the p+ structure) and pull down the n-base potential as well as the p− well potential to near ground. Similarly, when the input bias $V_i$ is low (approximately ground), holes are generated on the surface of the n+ structure by band-to-band tunneling. These band-to-band tunneling generated holes will flow into the p-well region (which is at a lower potential than the n+ structure) and pull up the p-well potential to approximately $V_{cc}$. Thus, the p-well potential is set by the above mechanism and is the opposite polarity to the input $V_i$.

Several points should be made of the inverter 301 of FIG. 1. First, the n− base and p-well should have a dopant concentration that is high enough so that there is no MOS action in the parasitic n-MOS or p-MOS. The p-well is floating and it serves as the output of the inverter 301. Moreover, there is no lightly doped drain (LDD) structure, implant, or spacer. Therefore, the surface of the n+ structure and the p+ structure can generate holes and electrons, respectively, by band-to-band tunneling (BBT). This, in turn, will result in gate-induced drain leakage (GIDL) current with large enough magnitude and will operate to set the potential of the p-well rapidly.

The GIDL current typically occurs in thin gate oxide MOS devices and is current between the drain and the body. The basis of the GIDL current is band-to-band tunneling that occurs on the surface of the gate-to-drain overlap region. Additional information on GIDL current may be found in "Design for Suppression of Gate-Induced Drain Leakage in LDD MOSFET's Using a Quasi-2-Dimensional Analytical Model," by Parke et al., IEEE Transactions on Electron Devices, Vol. 39, No. 7, July 1992, pp. 694–1702. In that article, the authors explain that an n+ region underneath a gate edge produces a high vertical electrical field that results in hole generation on the surface of an n+ region underneath the gate by band-to-band tunneling in the device. Those techniques mentioned in this article for suppressing GIDL current may be used in an opposite manner for maximizing GIDL current in the present application.

It should also be noted that the inverter 301 can be fabricated by a process that is fully compatible with standard CMOS processes. Specifically, all of the process steps described above to form the inverter 301 are commonly used in a CMOS process flow for the formation of transistors. Additionally, the inverter 301 is much smaller than a conventional CMOS inverter. Also important, there is no DC power consumption if the output is connected to the next stage by capacitive coupling. This is particularly useful for SRAMs, where there is no need of "local interconnect" technology.

Figure 2:
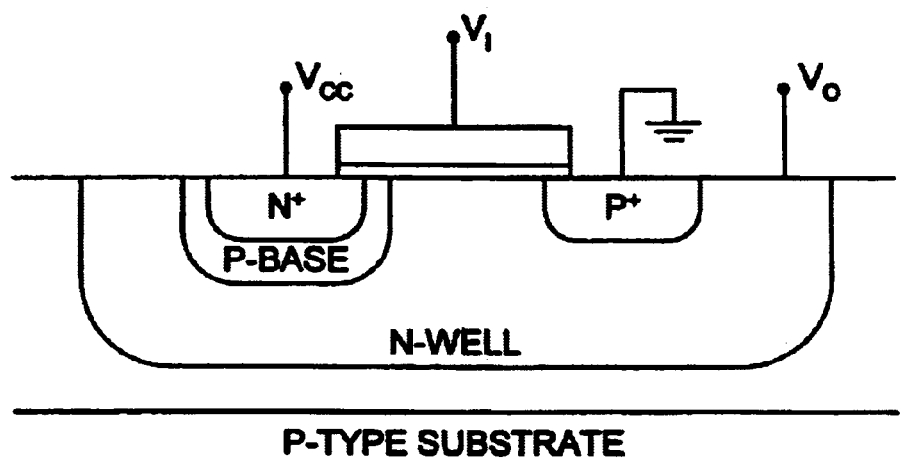
FIG. 2 is a cross-section view of a semiconductor substrate having formed therein an n-well CMOS inverter in accordance with the present invention.

By inverting the polarities of the conduction type and biases, a corresponding new inverter structure with an n-well as the output node may be manufactured. Such a device is shown in FIG. 2. Contacts and interconnects are formed to the various structures in the inverter 301. For example, the p+ structure and the p-type substrate are connected to ground (or more generically $V_{ss}$). The gate structure 303 is connected to an input terminal $V_i$. The n+ structure is connected to a biasing voltage $V_{cc}$. Finally, the n-well is electrically connected to the output terminal $V_o$.

For this embodiment, when the input bias $V_i$ is high (or approximately $V_{cc}$), electrons are generated on the surface of the p+ structure by band-to-band tunneling. These band-to-band tunneling generated electrons will flow into the n-well region (which has a higher potential than the p+ structure) and pull down its potential to approximately ground. Similarly, when the input bias is low (approximately ground), holes are generated on the surface of the n+ structure by band-to-band tunneling. These band-to-band tunneling generated holes will flow into the n-well region (which has a lower potential than the n+ structure) and pull up its potential to approximately $V_{cc}$. Thus, the n-well potential as set by the above mechanism and is the opposite to the input $V_i$.

Figure 3:
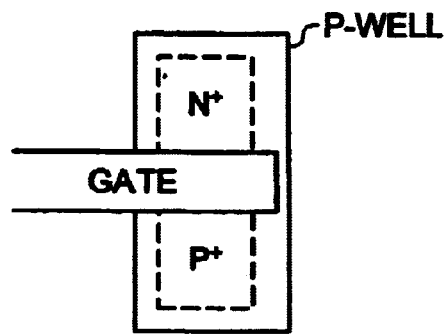
FIG. 3 is a top layout view of a p-well CMOS inverter in accordance with the present invention.
Figure 4:
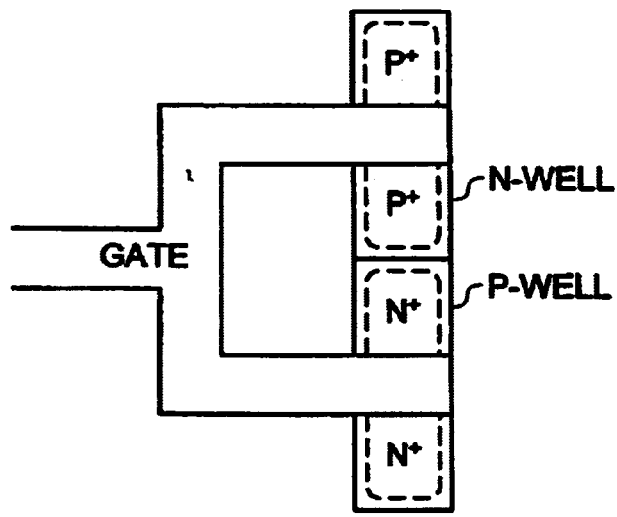
FIG. 4 is a top layout view of a prior art CMOS inverter.

A comparison of the layout implementation of a conventional prior art inverter and the inverter 301 of the present invention is shown in FIGS. 3 and 4. As can be seen, the new inverter in accordance with the present invention is approximately 50 percent smaller than a conventional CMOS inverter.

The utilization of the body (p-well or n-well) in the new "GIDL" transistor described above as the output node is particularly suitable for devices fabricated on SOI wafers. It is well-known that conventional MOS transistors fabricated on SOI will suffer from the "floating-body" effect. Furthermore, the building blocks of logic circuits, i.e., NAND and NOR gates, can be easily fabricated from such new transistors on SOI, but not possibly fabricated on bulk wafers.

The following describes the details of how the GIDL transistors fabricated on SOI wafers can be constructed into NAND and NOR logic gates.

Figure 5:
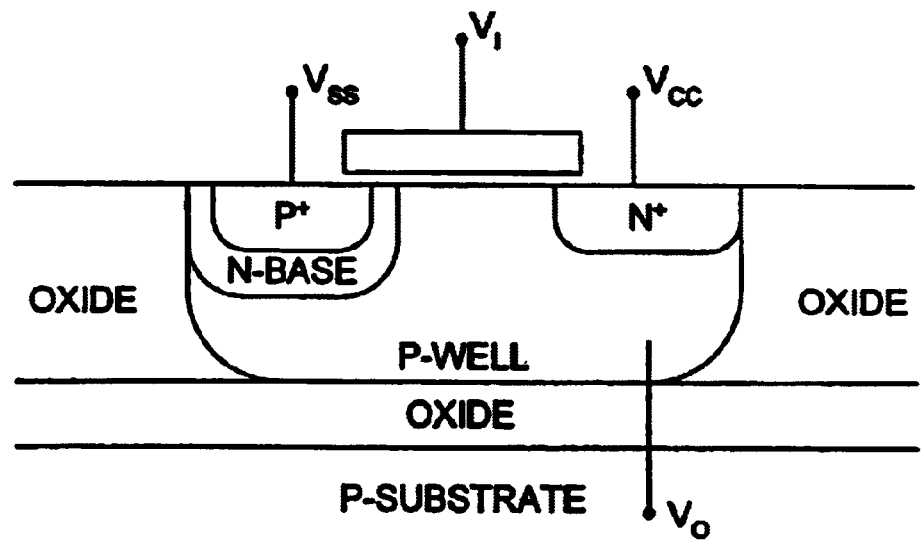
FIG. 5 is a schematic diagram of a p-well inverter of the present invention formed on a thick silicon layer of a SOI wafer.
Figure 6:
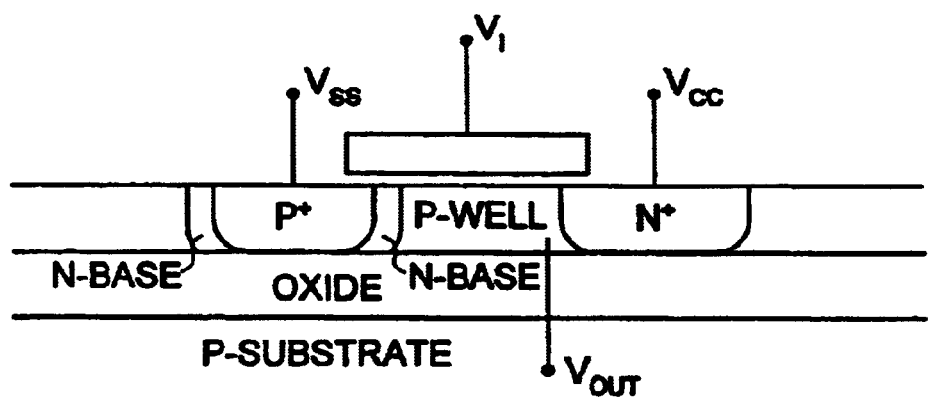
FIG. 6 is a schematic diagram of a p-well inverter of the present invention formed on a thin silicon layer of a SOI wafer.

Transistor Structures on SOI:

The GIDL transistors (with the p-well as the output) fabricated on SOI wafers with thicker (e.g., >0.3 um) and thinner (<0.15 um) silicon layers are illustrated in FIGS. 5 and 6 (not to scale), respectively. The new transistor can function as an inverter in both cases. Notice that in the case of the thin silicon layer of FIG. 6, the p-well is isolated in between the n+ and p+ junctions. Thus, thin SOI wafers can result in device structures isolated by both junctions as well as the oxide layer. The building blocks of logic circuits, i.e. NAND and NOR gates, can be easily fabricated on thin SOI wafers, but not as easily on thick SOI.

Figure 7:
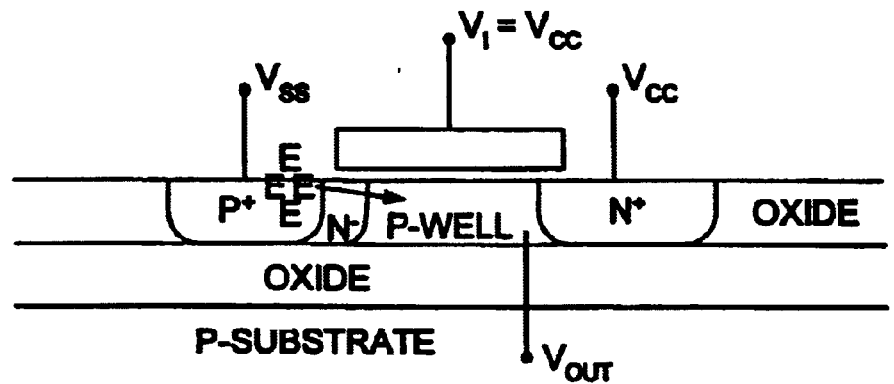
FIG. 7 is a schematic diagram of a p-well inverter of the present invention when the input is high.

Operation of Transistor with GIDL Switches:

The operation of the GIDL transistor of FIGS. 5 and 6 as an inverter is described below. The surface of gated n+ and p+ junctions are used for GIDL current generation controlled by the gate ($V_t$) to induce band-to-band tunneling. Referring to FIG. 7, if the input bias ($V_t$) is high ($V_{CC}$), there are electrons generated on the surface of p+ junction, which will flow into the n-base region and pull down the n-base potential and the p-well (output) potential to $V_{SS}$. The gated p+ junction serves as a GIDL switch which can turn on and off the electron GIDL current by the gate.

Figure 8:
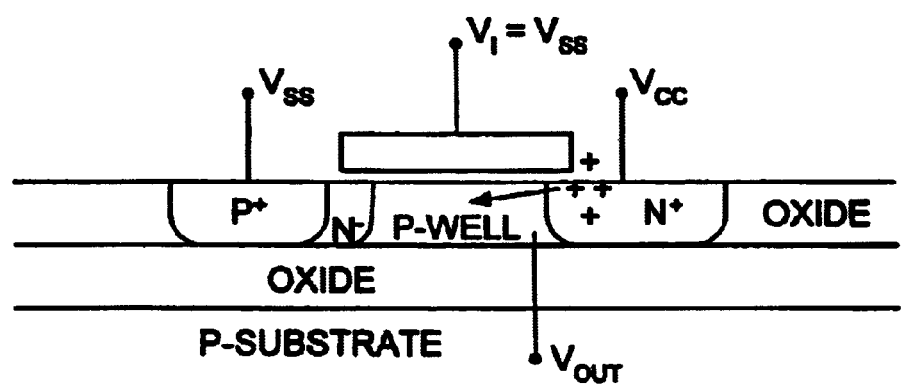
FIG. 8 is a schematic diagram of a p-well inverter of the present invention when the input is low.
Figure 9:
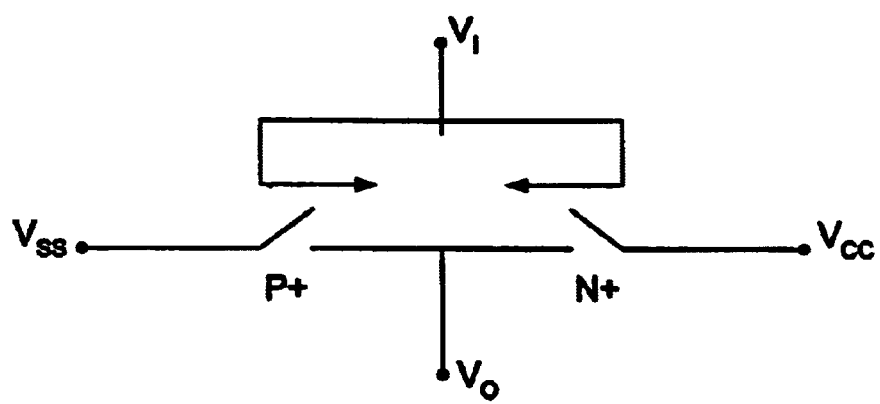
FIG. 9 shows a schematic representation of the GIDL transistor of the present invention.

Similarly, referring to FIG. 8, if the input bias is low ($V_{SS}$), there are holes generated on the surface of n+ junction, which will flow into the p-well region and pull up the p-well potential to $V_{CC}$. The gated n+ junction serves as a GIDL switch which can turn on and off the hole GIDL current by the gate. Notice that the n-base isolates the p+ junction and the p-well (output). Thus, the transistor serves as an inverter with two GIDL switches for turning on and off the electron and hole GIDL currents. FIG. 9 shows a schematic representation of the transistor of the present invention.

Figure 10:
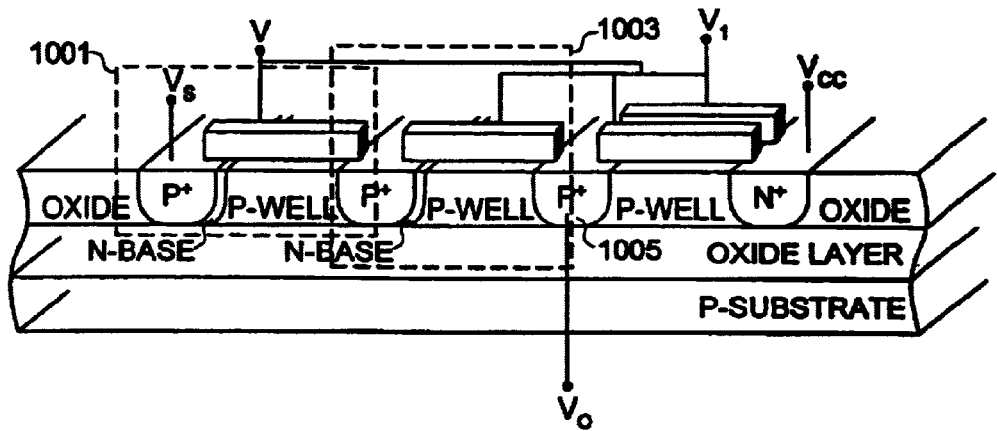
FIG. 10 is an isometric view of a NAND gate formed from the transistors of the present invention.

NAND Logic Gates by new Transistors with GIDL Switches:

By utilizing both the GIDL transistor as well as the isolation capability of thin silicon SOI wafers (by oxide and unction isolation), NAND and NOR logic gates are realized. FIG. 10 shows a two-input logic NAND gate with cross-section.

There are two p+ GIDL switches connected in series. The first p+ GIDL switch 1001 is controlled by a first input voltage V. The second p+ GIDL switch 1003 is controlled by a second input voltage V1. The first and second p+ GIDL switches 1001 and 1003 are connected in series. Thus, both V and V1 must be biased to the "high" position before the p+ GIDL switches 1001 and 1003 are "on" or "closed" allowing the voltage $V_s$ to be placed on a middle p+ junction 1005 as the output $V_o$. Note that the two p+ GIDL switches 1001 and 1003 are easily implemented on thin SOI wafers, where the two p-well regions are electrically isolated by junctions.

Additionally, there are two n+ GIDL switches connected in parallel, each controlled by the input voltages V and V1. Thus, if either or both V or V1 is biased to "low", then one of the n+ GIDL switches will be placed in the "on" or "closed" position. This corresponds to holes flowing from the n+ structure (at $V_{cc}$) down into the p-well (serving as $V_o$) causing $V_o$ to be "high". However, if both V and V1 are biased high, neither of the n+ GIDL switches are "on" or "closed" and no holes will flow to the p-well ($V_o$). The result is $V_o$ is "low".

Multiple input NAND gates can be similarly fabricated. Note that if the two p+ GIDL switches 1001 and 1003 are fabricated on thick SOI or bulk wafers, the two p+ switches 1001 and 1003 cannot function as series p+ switches because their p-wells are connected together into one piece. Thus, such a structure cannot function as a NAND gate.

Figure 11:
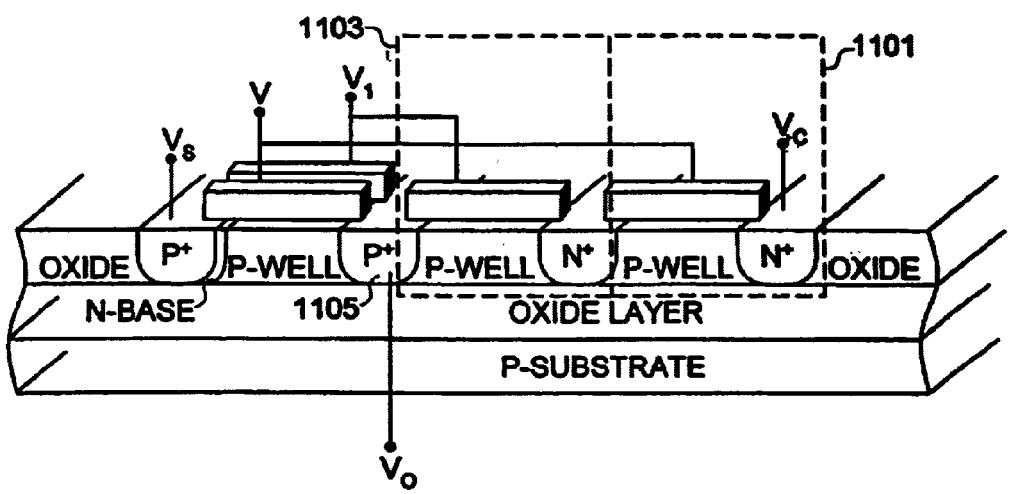
FIG. 11 is an isometric view of a NOR gate formed from the transistors of the present invention.

NOR Logic Gates by new Transistors with GIDL Switches:

A two-input logic NOR gate in cross-section is shown in FIG. 11. There are two n+ GIDL switches connected in series. The first n+ GIDL switch 1101 is controlled by a first input voltage V. The second p+ GIDL switch 1103 is controlled by a second input voltage V1. The first and second n+ GIDL switches 1101 and 1103 are connected in series. Thus, both V and V1 must be biased to the "low" position before the n+ GIDL switches 1101 and 1103 are "on" allowing the voltage $V_c$ to be placed on a middle p+ junction 1105 as output $V_o$. Note that the two n+ GIDL switches 1001 and 1003 are easily implemented on thin SOI wafers, where the two p-well regions are electrically isolated by junctions.

Additionally, there are two p+ GIDL switches connected in parallel, each controlled by the input voltages V and V1. Thus, if either V or V1 are biased to "high", then one of the p+ GIDL switches will be placed in the "on" position, making $V_o$ low.

Multiple input NOR gates can be similarly fabricated. Note that it is impossible to have the NOR function if these two n+GIDL switches are fabricated on thick SOI or bulk wafers, because their p-wells would be connected together into one piece and not electrically isolated.

Figure 10A:
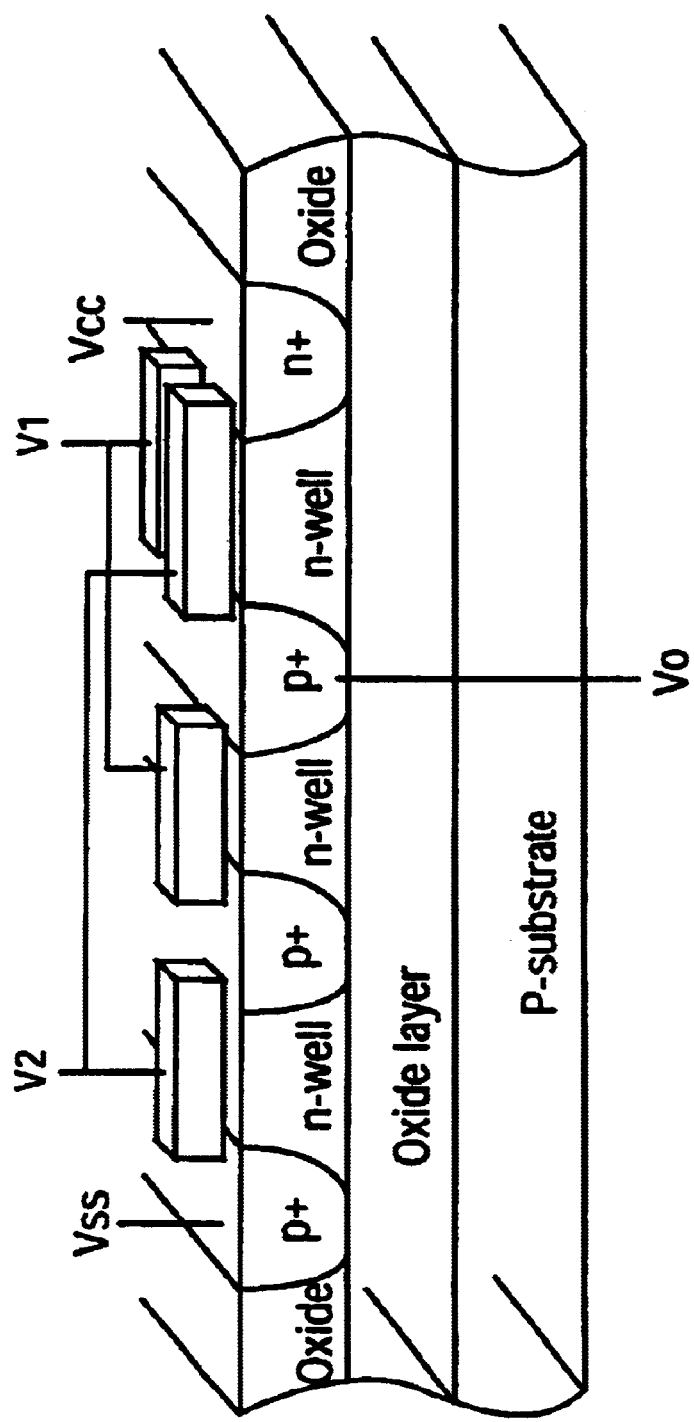
FIG. 10A is an isometric view of an alternative embodiment of a NAND gate formed from the transistors of the present invention.
Figure 11A:
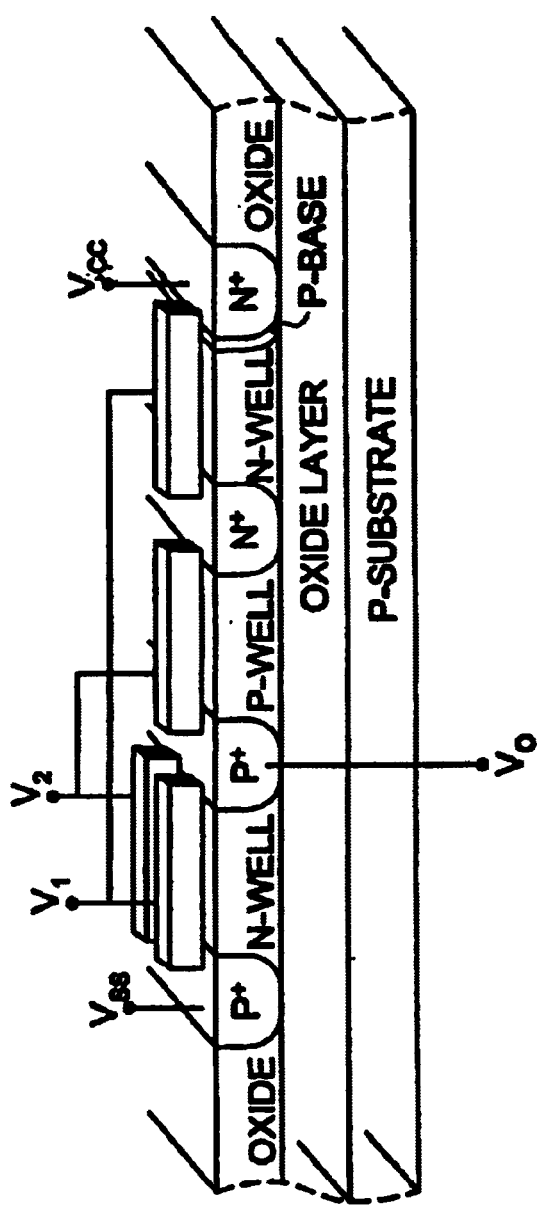
FIG. 11A is an isometric view of an alternative embodiment of a NOR gate formed from the transistors of the present invention.

Variations of Structures:

Notice that the p-base and n-base serve as isolation of n+ and p+ regions with respect to the n-well and p-well, respectively. Thus, the p-base and n-base can be replaced by p-well and n-well, respectively, For example, the NOR gate in FIG. 11 is equivalent to FIG. 11A. The NAND gate in FIG. 10 is equivalent to FIG. 10A.

Figure 12:
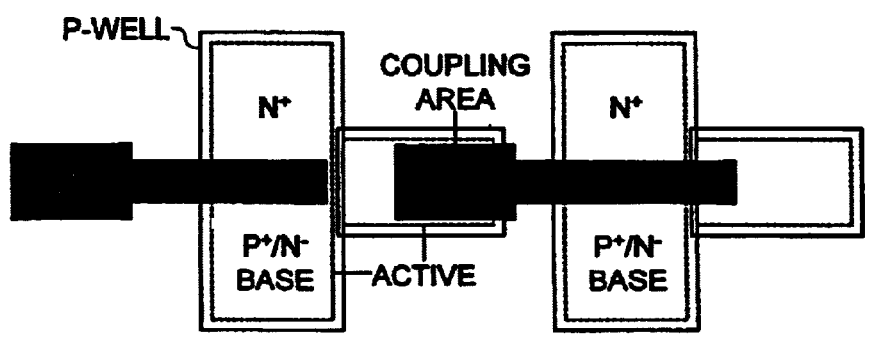
FIG. 12 shows the capacitive coupling of input and output elements of the transistor of the present invention.

Connection Between Logic Gates:

The output of logic gates can be connected to the input of the next gate by the use of conventional contact and metal lines. Alternatively, they can be connected by capacitive coupling as shown in FIG. 12. The coupling capacitor is easily implemented using the gate-oxide between the p-well and poly gate as capacitor. In addition, the coupling capacitors are also useful in many VLSI analog circuits applications for blocking of dc biases or level shifting.

Logic Gates using GIDL Transistors with n-well as Output:

The GIDL transistors fabricated on thin SOI with n-well can be used also to form the logic gates. The p-base is used as isolation between the n-well and n+ junction.

It is known that devices fabricated on thin SOI have the advantage of low junction capacitance. However, conventional MOS transistors on thin SOI have the well-known problem of "floating-body" effect, which results in higher leakage current at off state as well as spurious transients. The GIDL transistor described herein can eliminate these problems. Furthermore, a new solution for future VLSI devices on SOI is provided.

Additionally, GIDL transistors fabricated on thin SOI and based on GIDL current turning on and off utilize significantly less contacts and metal line connections. Only the $V_{CC}$ and $V_{SS}$ connections need contact and metal line connection. The connection between the output (fan-out) to subsequent stages can be connected by capacitor coupling. This provides a new design strategy that improves reliability, yield, and packing density.

Finally, note that the two types of GIDL transistor have the same equivalent circuit representation; therefore, more complex logic circuits can be implemented by using either types of GIDL transistors (n-well or p-well as output) or a mixture thereof. The differences are in the electrical separation between the output node to either n+ or p+ junctions, e.g. the p-well output node is separated from the p+ junction by the n-base, and the n-well output is separated from the n+ junction by the p-base.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A NAND logic circuit having a first input and a second input, comprising:
   a semiconductor substrate;
   an insulator formed on said semiconductor substrate;
   a semiconductor layer formed on said insulator layer;
   a p-well formed in said semiconductor layer;
   a first gate structure formed atop said p-well, said first gate structure being the first input and being formed from a thin gate oxide layer underneath a conductive layer;
   a second gate structure formed atop said p-well, said second gate structure being the second input and being formed from a thin gate oxide layer underneath a conductive layer;
   a p+ structure formed adjacent to a first edge of said first gate structure and said second gate structure, said p+ structure being the output of said NAND logic circuit;
   an n+ structure formed adjacent to a second edge of said first gate structure and said second gate structure;
   a first switch formed in said semiconductor layer, said first switch electrically connected to said first input; and
   a second switch formed in said semiconductor layer in series to said first switch and electrically connected to said second input, said second switch also electrically connected to said p+ structure.

2. The NAND gate of claim 1 wherein said p-well extends through said semiconductor layer to said insulator.

3. The NAND gate of claim 1 wherein said p+ structure and said n+ structure extend through said semiconductor layer to said insulator.

4. The NAND gate of claim 1 wherein said semiconductor layer is less than 1500 angstroms thick.

5. A NAND logic circuit having a first input and a second input, comprising:
   a semiconductor substrate;
   an insulator formed on said semiconductor substrate;
   a semiconductor layer formed on said insulator layer;
   a n-well formed in said semiconductor layer;
   a first gate structure formed atop said n-well, said first gate structure being the first input and being formed from a thin gate oxide layer underneath a conductive layer;
   a second gate structure formed atop said n-well, said second gate structure being the second input and being formed from a thin gate oxide layer underneath a conductive layer;
   a n+ structure formed adjacent to a first edge of said first gate structure and said second gate structure;
   a p+ structure formed adjacent to a second edge of first gate structure and said second gate structure, said p+ structure being the output of said NAND logic circuit;
   a first switch formed in said semiconductor layer, said first switch electrically connected to said first input; and
   a second switch formed in said semiconductor layer in series to said first switch and electrically connected to said second input.

6. The NAND gate of claim 5 wherein said n-well extends through said semiconductor layer to said insulator.

7. The NAND gate of claim 5 wherein said p+ structure and said n+ structure extend through said semiconductor layer to said insulator.

8. The NAND gate of claim 5 wherein said semiconductor layer is less than 1500 angstroms thick.

* * * * *